(12) United States Patent
Alpert et al.

(10) Patent No.: US 7,448,007 B2
(45) Date of Patent: Nov. 4, 2008

(54) SLEW CONSTRAINED MINIMUM COST BUFFERING

(75) Inventors: Charles J. Alpert, Cedar Park, TX (US); Arvind K. Karandikar, Austin, TX (US); Tuhin Mahmud, Austin, TX (US); Stephen T. Quay, Austin, TX (US); Chin Ngai Sze, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 11/457,495

(22) Filed: Jul. 14, 2006

(65) Prior Publication Data

US 2008/0016479 A1    Jan. 17, 2008

(51) Int. Cl.
*G06F 17/50* (2006.01)
*G06F 9/45* (2006.01)

(52) U.S. Cl. .................................. 716/6; 716/5; 716/18
(58) Field of Classification Search ..................... 716/1, 716/6, 18, 5
See application file for complete search history.

(56) References Cited

U.S. PATENT DOCUMENTS 6,253,356 B1 *   6/2001   Kung ............................. 716/5
6,996,512 B2 *   2/2006   Alpert et al. ................... 703/14
7,127,696 B2 *  10/2006   Alpert et al. ................... 716/10
7,191,418 B2 *   3/2007   Lee et al. ....................... 716/6

OTHER PUBLICATIONS

L. Van Ginneken, "Buffer Placement in Distributed RC-tree Networks for Minimal Elmore Delay," IEEE Proceedings (ISCAS) pp. 865-868 (1990).
J. Lillis et al., "Optimal Wire Sizing and Buffer Insertion for Low Power and a Generalized Delay Model," IEEE Journal of Solid State Circuits, vol. 31, No. 3, pp. 437-447 (1996).
C. Alpert et al., "A Practical Methodology for Early Buffer and Wire Resource Allocation," ACM/IEEE Proceedings (DAC) pp. 189-194 (2001).
C. Alpert et al., "Minimum-Buffered Routing of Non-Critical Nets for Slew Rate and Reliability Control," IEEE/CAN Proceedings (ICCAD) pp. 408-415 (2001).

* cited by examiner

*Primary Examiner*—Jack Chiang
*Assistant Examiner*—Nghia M Doan
(74) *Attorney, Agent, or Firm*—Casimer K. Salys; Jack V. Musgrove

(57) ABSTRACT

A buffer insertion technique addresses slew constraints while minimizing buffer cost. The method builds initial solutions for the sinks, each having an associated cost, slew and capacitance. As a solution propagates toward a source, wire capacitance and wire slew are added to the solution. When a buffer is selected for possible insertion, the slew of the solution is set to zero while the cost of the solution is incremented based on the selected buffer and the capacitance is set to an intrinsic capacitance of the buffer. The solutions of two intersecting wire branches are merged by adding branch capacitances and costs, and selecting the highest branch slew. The solution sets are updated by disregarding solutions which have a slew component greater than a slew constraint, and any solution that is dominated by another solution is eliminated. The solution having the smallest cost is selected as the final solution.

4 Claims, 5 Drawing Sheets

SLEW CONSTRAINED MINIMUM COST BUFFERING

BACKGROUND OF THE INVENTION

1. Field of the Invention

The present invention generally relates to the design of semiconductor chips and integrated circuits, and more particularly to the use of buffer insertion to manage timing and electrical requirements in an integrated circuit design.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. timing objectives and fixing electrical violations for interconnects. Higher relative interconnect resistance forces buffers to be placed closer together to achieve optimal performance. It is estimated that the number of buffers will rise dramatically, reaching about 15% of the total cell count for intrablock communications for 65 nanometer technology, and close to 800,000 buffers required for 50 nanometer technologies. Therefore, both the complexity and importance of buffer insertion is increasing in an even faster pace.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates, insert buffers, clone gates, etc., so the area of logic in the design remains fluid. However, physical synthesis can take days to complete.

During physical synthesis, buffer insertion is called for to either optimize nets for delay or to fix nets due to electrical violations. One mechanism for performing buffer insertion on a fixed Steiner integrated circuit topology is known as the van Ginneken algorithm, described in the article "Buffer Placement in Distributed RC-tree Networks for Minimal Elmore Delay," L. van Ginneken, IEEE Proceedings (ISCAS) pp. 865-868 (1990). Given a fixed Steiner tree topology, the van Ginneken algorithm finds the optimal buffer placement on the topology under an Elmore delay model for a single buffer type and simple gate delay model. The primary idea of van Ginneken is to choose a set of buffer candidate locations that lie on the Steiner topology at some uniformly fixed distance apart. Buffer insertion then proceeds for that particular set of candidates from sink to source. When a candidate location falls within a region that is blocked because it is too densely populated with logic, that location is skipped and a buffer is This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Faster performance and predictability of responses are elements of interest in circuit designs. As process technology scales to the submicron regime, interconnect delays increasingly dominate gate delays. Consequently, physical design optimization tools such as floorplanning, placement, and routing are becoming more "timing-driven" than the previous generation of tools. Owing to the tremendous drop in VLSI feature size, a huge number of buffers (i.e., amplifiers or inverters) are needed for achieving inserted into the next candidate insertion location that is not blocked while maintaining the uniform spacing.

As seen in FIG. 1, a Steiner tree representation of a net 1 places candidate buffer insertion points 2 at regular intervals along the paths from source 3 to sinks 4 and 5. A buffer blockage 6 such as a memory array or IP core is present in the path of the net. The portion of the net block by logic cell 6 is skipped when determining candidate buffer insertion points 2. The spacing between candidate insertion points may be increased or decreased by the designer to achieve a particular timing requirement. Increasing the frequency of buffer insertion locations can improve timing of the net, but at an increased buffer cost, i.e., an increased size or area of the silicon chip used for the buffers.

A variation of the van Ginneken approach can be used to minimize a cost function subject to given timing constraints, as explained in the article "Optimal Wire Sizing and Buffer Insertion for Low Power and a Generalized Delay Model," J. Lillis et al., IEEE Journal of Solid State Circuits, vol. 31, no. 3, pp. 437-447 (1996). According to that methodology, different possible solutions are examined at each potential buffer node, progressing in a bottom-up direction from a sink to a source (postorder traversal). FIG. 1 illustrates two possible solutions for the buffer location next to sink 5, a first solution with no buffer and a second solution with a buffer at that location. The next iteration of the analysis has four possible solutions that build on the first set of solutions: one solution with no buffer at either of the two locations; two solutions with only one buffer location at either of the two locations; and one solution with buffers at each of the two locations. At any point in the analysis "suboptimal" solutions may be eliminated. Each solution is associated with a three-tuple comprised of capacitance/cost/slack (C, W, Q), and a solution is deemed suboptimal if each of these three components is worse than the corresponding components of any other solution. In this example, the fourth solution with buffers at both of the first two buffer locations is suboptimal and removed from further consideration.

Two possible solutions are similarly built for the branch starting with sink 4. There are accordingly six possible solutions presented to the next buffer location upstream from logic cell 6. The process of propagating different solutions continues for all wire branches and all buffer locations until the source (driver) is reached, with suboptimal solutions continuously pruned. Solutions which violate the delay constraint at the driver are also pruned. The set of solutions which survive thus excel in at least one aspect of downstream capacitance, buffer cost or slack (required arrival time, or RAT). The buffer assignments selected as the final solution correspond to the solution with the smallest overall cost.

While this approach provides a valuable tool for delay optimization, it does not address other important electrical characteristics such as slew. Slew (or slew rate) refers to the rise time or fall time of a switching digital signal. Different definitions can be used to quantify slew, the most common being the 10/90 slew which is the time it takes for a waveform to cross from the 10% signal level to the 90% signal level. Other definitions such as 20/80 slew or 30/70 slew are often used when the waveform has a slowly rising or falling tail. Since higher interconnect resistivity also causes signal integrity to degrade more quickly with each advancing technology, buffers need to be inserted on long interconnects to meet slew constraints. The number of buffers on a typical chip is rising dramatically due to this increasing interconnect resistance. For example, an application-specific integrated circuit (ASIC) designed for use in a computer server might have between 2 and 3 million gates. Electrical correction for such a circuit might take as long as 46 hours, with the insertion of as many as 500,000 buffers. This large number of buffers can degrade overall design performance by forcing the rest of the logic to be spread further apart to accommodate the buffers. The buffers themselves are a drain on power and can cause other gates to be sized to higher power levels since they are further apart on the chip.

Prior art buffer insertion tools fail to adequately deal with slew constraints as they pertain to the increased costs from buffering. An extension of the Lillis algorithm accommodates a generalized decay model which takes into account the effect of signal slew of buffer delay which can contribute to overall delay. However, that approach merely integrates slew constraints while still optimizing for delay, and buffering of non-critical nets may result in unnecessary runtime and resource overhead. Other approaches have different limitations. Length-based buffering, as described in the article "A Practical Methodology for Early Buffer and Wire Resource Allocation," C. Alpert et al., ACM/IEEE Proceedings (DAC) pp. 189-194 (2001), tries to reduce buffer and wire congestion but it can be area inefficient especially in the presence of blockages and its handling of multi-fanout nets. Another method described in the article "Minimum-Buffered Routing of Non-Critical Nets for Slew Rate and Reliability Control," C. Alpert et al., IEEE/CAN Proceedings (ICCAD) pp. 408-415 (2001), addresses slew constraints without regard to delay; however that technique does not model slew, it just simplifies the slew constraint to be equivalent to a capacitance constraint, so interconnected resistivity is not actually modeled. While appropriate for vary large fanout nets (e.g., over 1000 sinks), it essentially becomes equivalent to length-based buffering. It would, therefore, be desirable to devise an improved method of buffer insertion which could control slew violations while reducing or minimizing buffer cost. It would be further advantageous if the method could be carried out independently of the timing analysis.

SUMMARY OF THE INVENTION

It is therefore one object of the present invention to provide an improved method of buffer insertion for a net of an integrated circuit design.

It is another object of the present invention to provide such a method which reduces or minimizes the buffer cost (area) while maintaining legal slew constraints.

It is yet another object of the present invention to provide a method and system for buffer insertion which is efficient in the presence of blockages and handling of multi-fanout nets.

The foregoing objects are achieved in a method of providing a buffer tree for a net of an integrated circuit design, by building an initial solution set for the buffer tree from initial solutions for sinks of the net wherein each solution has an associated cost, slew and capacitance, generating sets of candidate solutions for wire branches which originate at the sinks and extend toward a source wherein the candidate solutions include components from the initial solutions and buffers positioned along the wire branches, updating the candidate solution sets by disregarding any candidate solutions which have a slew component greater than a slew constraint, and selecting a final solution which has a smallest cost from the updated candidate solution sets. In one implementation the buffers are selected from a buffer library having different buffer types, and candidate solutions are generated for each buffer type in the library. The initial solutions for each sink have a cost of zero, a slew of zero, and a capacitance corresponding to an intrinsic capacitance of the sink. As a solution propagates toward the source, the capacitance of an existing solution is increased by adding a wire capacitance of the new wire section and the slew is increased by adding a wire slew of the new wire section. When a buffer is selected for insertion at a potential location along the wire branch, the slew of an existing solution for the wire branch is set to zero while the cost of the existing solution is incremented based on the selected buffer and the capacitance of the existing solution is set to an intrinsic capacitance of the selected buffer. The solutions of two intersecting wire branches are merged by adding branch capacitances and costs, and selecting the highest branch slew. Any candidate solution that is dominated by another solution is eliminated.

The above as well as additional objectives, features, and advantages of the present invention will become apparent in the following detailed written description.

BRIEF DESCRIPTION OF THE DRAWINGS

The present Invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention provides a novel method for determining buffer insertion locations in a net of an integrated circuit design, and is generally applicable to any type of IC design, such as general-purpose microprocessors, memory units or special-purpose circuitry. The method may be implemented as part of a physical synthesis process which optimizes placement, timing, power consumption, crosstalk effects or other design parameters. As explained more fully below, an exemplary embodiment of the present invention provides a fast technique which can handle a large volume of nets to optimally solve slew buffering while also reducing buffering cost.

Figure 2:
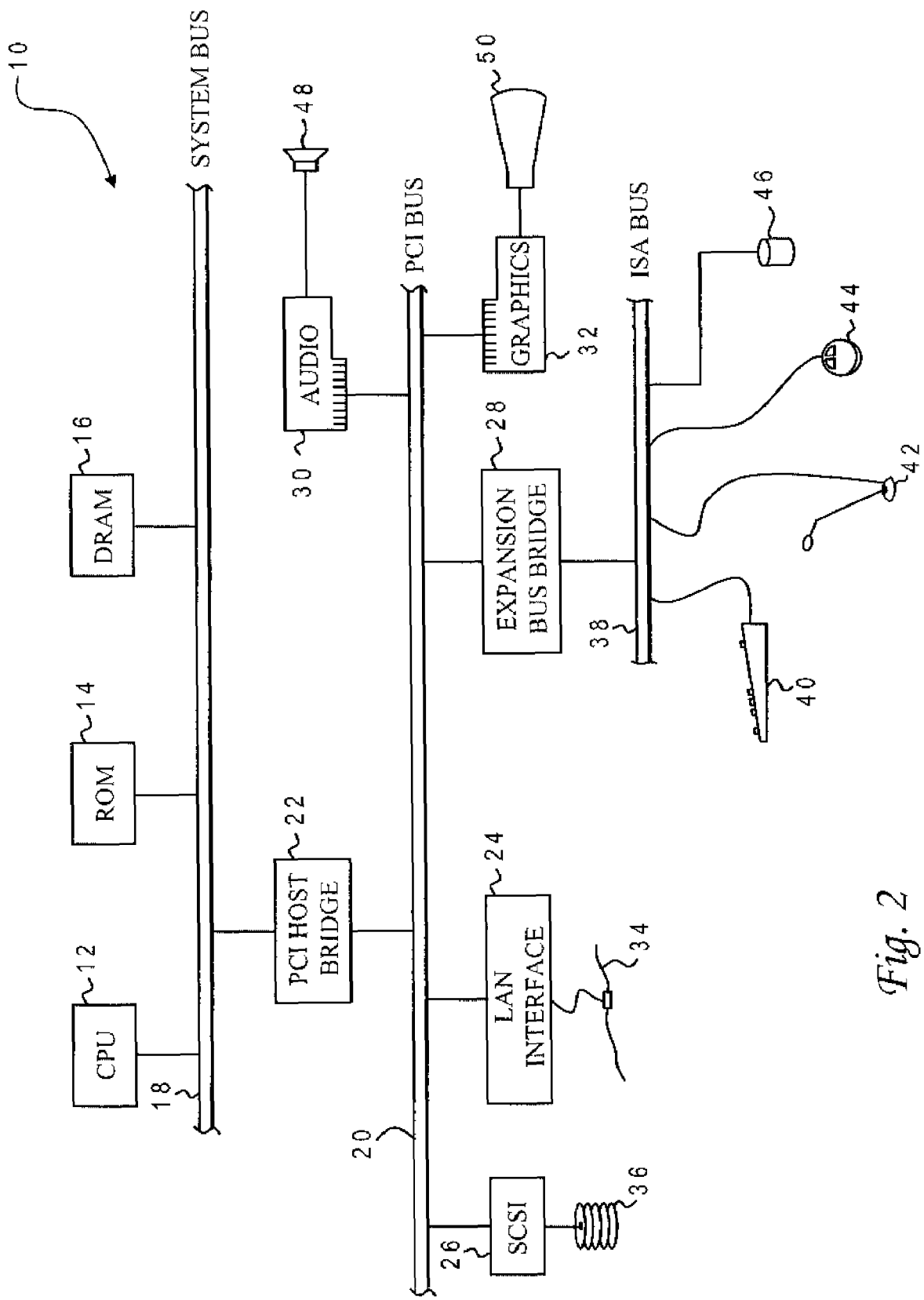
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out the buffer insertion in accordance with one implementation of the present invention. System includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the buffer insertion as taught herein.

While the illustrative implementation provides the program instructions embodying the present invention on disk drive 36, those skilled in the art will appreciate that the invention can be embodied in a program product utilizing other computer-readable media, including transmission media. The program instructions may be written in the C++ programming language for an AIX environment. Computer system 10 carries out program instructions for an interconnect optimization process that uses novel buffer insertion techniques to manage timing requirements and electrical violations. Accordingly, a program embodying the invention may include conventional aspects of various placement and timing tools, and these details will become apparent to those skilled in the art upon reference to this disclosure.

Figure 1:
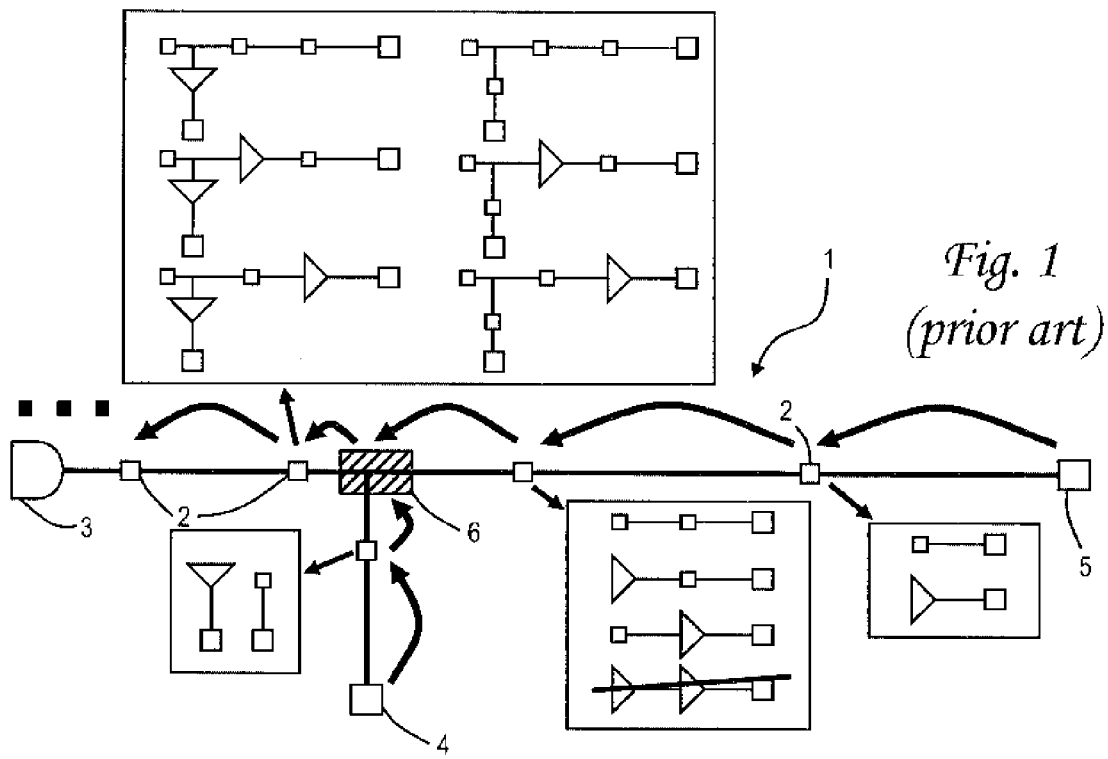
FIG. 1 is a diagram of a Steiner tree for a net of an integrated circuit design showing candidate buffer insertion points at regular intervals along the paths from a source to several sinks, according to the prior art van Ginneken algorithm.
Figure 3:
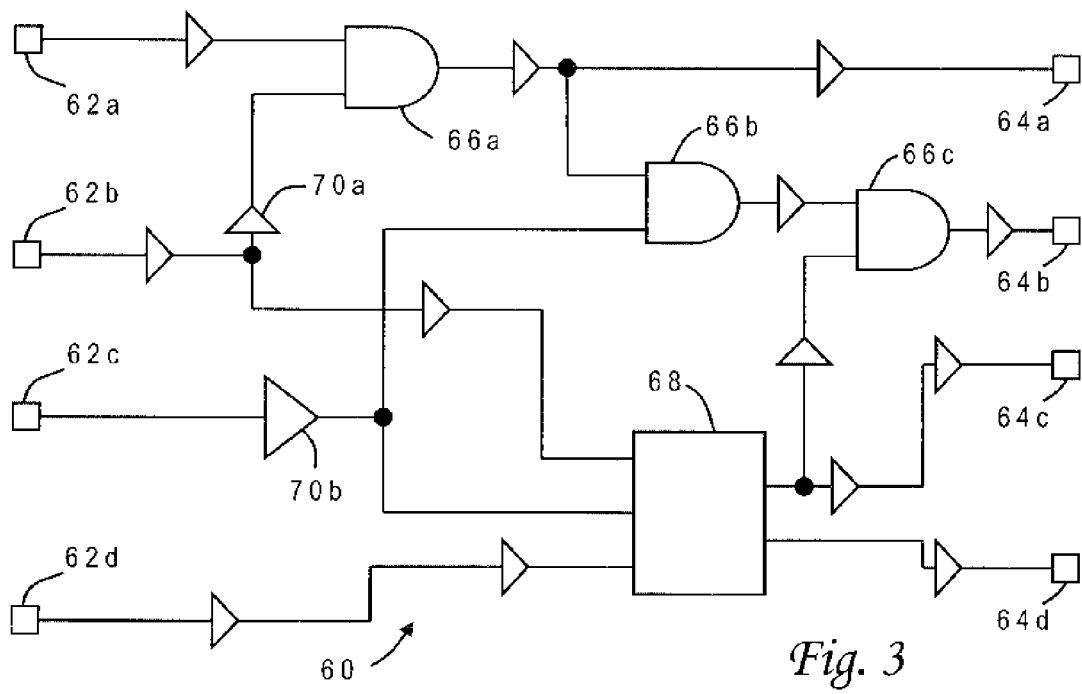
FIG. 3 is a schematic diagram illustrating an example of a circuit having various nets whose wiring is to be optimized as part of a physical synthesis process.

The present invention provides an improved method of determining buffer insertion locations which may be used to optimize slew and buffer cost of a net. The invention may be understood with reference to the generalized circuit 60 depicted in FIG. 3. Circuit 60 has four driving elements or primary inputs 62a, 62b, 62c, 62d, and four output nodes or sinks 64a, 64b, 64c, 64d. The sources are interconnected to the sinks via gates 66a, 66b, 66c or other combinational logic 68. The gates 66 and logic 68 act as sinks for upstream nets, and act as sources for downstream nets, forming a total of nine nets. The layout shown in FIG. 3 is one example of how a placement tool might provide wiring between the input and outputs based on a netlist. Candidate buffer locations are established for a Steiner topology of the nets at some uniformly fixed distance apart, such as 250 μm. A finer spacing will provide better timing but increases analysis time. The invention may be used with a buffer library have various types of buffers, including smaller buffers 70a or larger buffers 70b. The following nomenclature is used to identify the various aspects of the net and its buffer solutions;

T—a routing tree of the net, T=(V, E);
V—the set of vertices (branch points v) in the routing tree;
E—the set of edges (wire sections e) in the routing tree;
C—capacitance;
W—buffer cost (area);
S—slew;
B—a buffer library;
b—a specific buffer ($b_0$=no buffer);
γ—a buffer assignment, or candidate solution for a buffer assignment;
Γ—a solution set;
α—a slew constraint.

The present invention introduces slew into the buffer assignment algorithm to collect delay information for slew rate computation so as to enable the invention to perform in a dynamic programming framework. A given buffer solution γ is represented by an associated three-tuple (C, S, W) where C denotes the downstream capacitance at the current node, S denotes the cumulative slew along a bottom-up computation, and W denotes the total cost of the solution, i.e., buffer area. An initial solution set is built by providing initial solutions $\gamma_s$ for each sink of a given net, where the initial slew and cost are set to zero, and the capacitance is set to the intrinsic capacitance of the sink. A final solution for a wire branch propagates from one or more sinks toward an upstream source (postorder traversal). For example, in FIG. 3 the net having a source at gate 66a will have a solution that propagates from sink 64a and gate 66b toward gate 66a. As the solution propagates upstream, capacitance is increased by adding the capacitance of each wire section, and slew is increased by adding the slew of each wire section, which may be expressed according to Bakoglu's metric in terms of the Elmore delay. The invention generates sets of new solutions for each allowable buffer insertion location in respective wire branches, setting the new slew to zero when a buffer is inserted, incrementing the new cost based on the particular buffer selected, and setting the new capacitance to the intrinsic capacitance of the buffer.

Solution sets for intersecting branches are merged by adding the branch capacitances and costs, and selecting the highest branch slew. Solutions are continually optimized with regard to the slew constraint, i.e., any candidate solutions which have a slew component greater than the slew constraint are disregarded, and dominated solutions are eliminated. When the progression reaches a source (e.g., gate 66*a*), the solution with the least cost is selected as the final solution for that net. The buffer insertion algorithm is repeated for each net in circuit 60.

Figure 4:
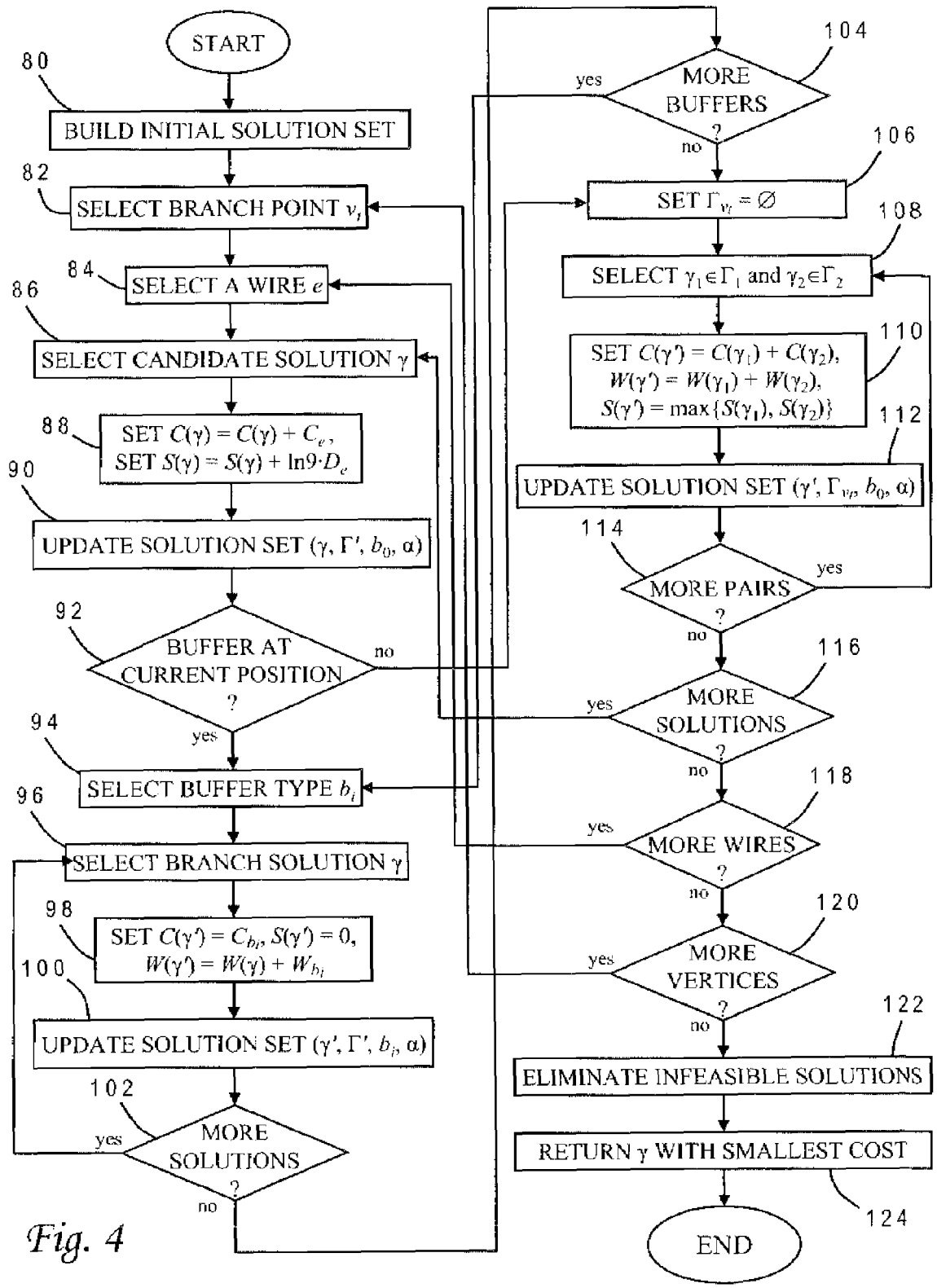
FIG. 4 is a chart illustrating the logical flow for a buffer assignment process in accordance with one implementation of the present invention.

The present invention may be understood in further detail with reference to the chart of FIG. 4, which illustrates the logical flow of a slew constrained minimum cost buffering process for a binary routing tree T in accordance with one implementation. The process begins (80) by building an initial solution set for each sink s where $S(\gamma_s)=0$, $W(\gamma_s)=0$, and $C(\gamma_s)=C_s$ (the sink capacitance). Each branch point/driver $v_t$ is iteratively examined (82) in the order given by a postorder traversal of T, and a wire e in one of the branches is further selected for analysis (84). Each candidate solution γ for the selected wire is updated (86) by setting $C(\gamma)=C(\gamma)+C_e$ and $S(\gamma)=S(\gamma)+\ln 9 \cdot D_e$, where $C_e$ is the edge capacitance and $D_e$ is the Elmore delay for the current wire section (88). The Elmore delay can further be expressed as $D_e=R_e(C_e/2+C(\gamma))$ where $R_e$ is the lumped resistance of the wire section. The solution set Γ' corresponding to the branches T' of the selected branch point/driver $v_t$ is then updated (assuming no buffer insertion at the current location, $b=b_0$) to check whether any solutions violate the slew constraint and to see if any solutions are dominated (90). The solution set update procedure is described further below in conjunction with FIG. 5.

After updating the branch solution set, a determination is made as to whether a buffer is allowed at the current position (92). The position may be blocked by some design constraint such as a logic cell or gate. If a buffer is allowed, the process continues by selecting one of the available buffers $b_i$ in the buffer library (94). For each branch solution (96), a new solution γ' is generated by setting $C(\gamma')=C_{bi}$, $S(\gamma')=0$, and $W(\gamma')=W(\gamma)+W_{bi}$, where $C_{bi}$ is the intrinsic capacitance of the selected buffer and $W_{bi}$ is the cost of the buffer (98). The branch solution set is again updated with $b=b_i$ to check whether any new branch solutions violate the slew constraint and to see if any new branch solutions are dominated (100). New solutions are so generated and updated for each branch solution (102), and for each buffer type in the buffer library (104).

If no buffer is allowed at the current position, the buffer analysis is skipped and the process continues with merging of the two branches of the selected vertex (106) by first setting a merged solution set to an empty set, i.e., $\Gamma_{vt}=\emptyset$. Each potential pair of branch solutions (one solution from each branch, i.e., each $\gamma_1 \in \Gamma_1$ and $\gamma_2 \in \Gamma_2$) are selected for analysis (108). A new merged solution γ' is generated by setting $C(\gamma')=C(\gamma_1)+C(\gamma_2)$, $W(\gamma')=W(\gamma_1)+W(\gamma_2)$, and $S(\gamma')=\max\{S(\gamma_1),S(\gamma_2)\}$ (110). The merged solution set is updated with $b=b_0$ to check whether any new merged solutions violate the slew constraint and to see if any new merged solutions are dominated (112). The process continues iteratively at step 108 for each pair of branch solutions (114). If there are more candidate solutions (116), the process continues iteratively at stop 86. Once all candidate solutions have been analyzed, the process continues iteratively at step 84 for other wire branches (118). Once all the wire branches for the selected vertex have been analyzed, the process continues iteratively at step 82 for other vertices (120). Once all vertices have been analyzed, infeasible solutions at the driver are eliminated (122), and the solution with the smallest cost is returned as the final solution (124).

Figure 5:
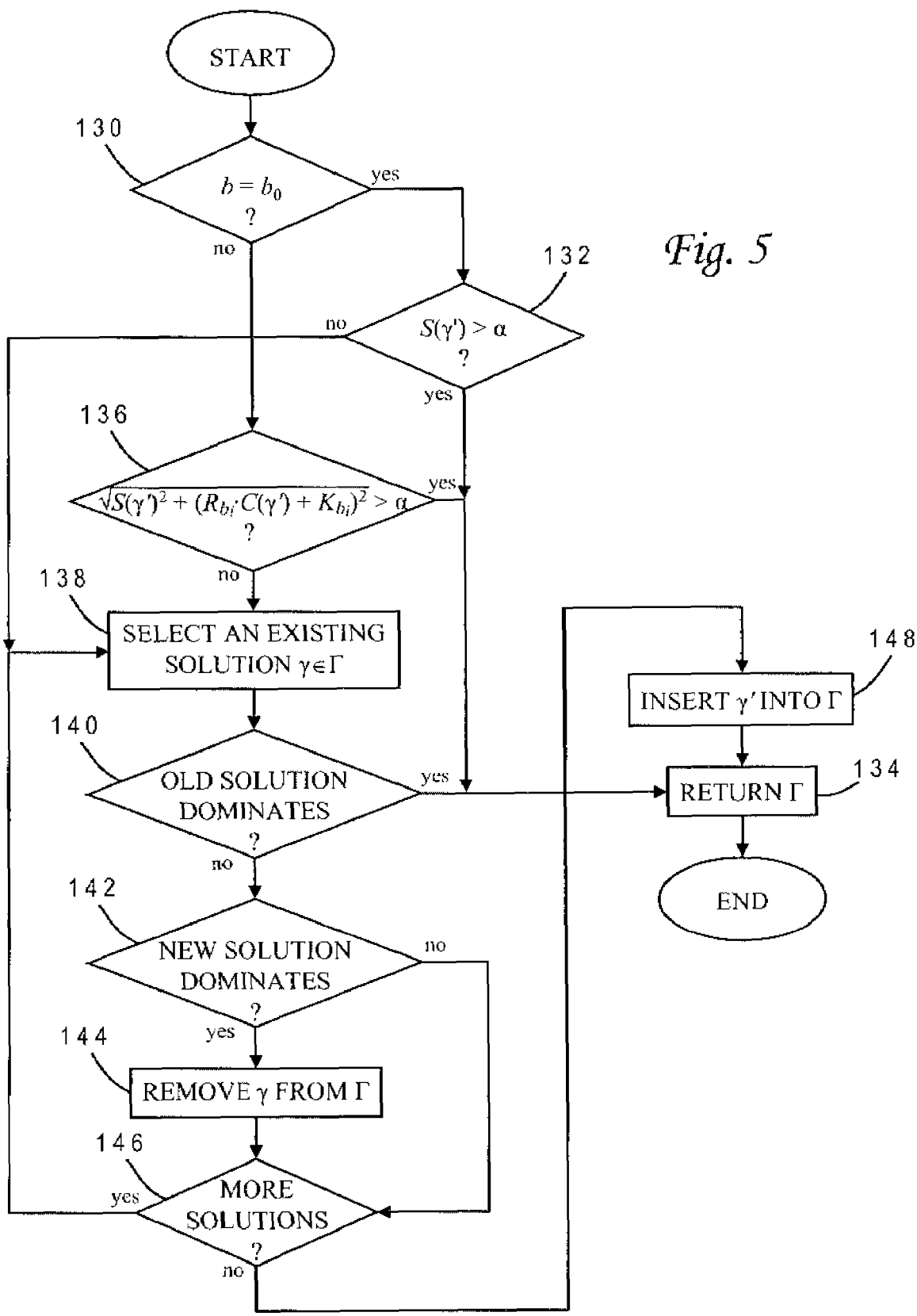
FIG. 5 is a chart illustrating the logical flow for one implementation of a solution set update procedure that is used with the process of FIG. 4.

Details of the solution set update procedure are shown in the flow chart of FIG. 5. The procedure receives as inputs a candidate solution γ', an existing solution set Γ, a buffer type b, and a slew constraint α. A check is made to see whether the new solution violates the slew constraint, but the buffer type is first examined to see if any buffer is present (130). If no buffer is present at the current location ($b=b_0$), the slew constraint is simply compared to $S(\gamma')$ (132). If the slew for the new solution is greater than the constraint, the procedure returns the existing solution set without modification (134). If a buffer is present (136), the slew formula for the new solution is calculated as the root-mean square of the gate slew and the interconnect slew as taught in U.S. Pat. No. 6,868,533, i.e., $$\text{Totalslew} = \sqrt{(\text{GateSlew})^2 + (\text{WireSlew})^2} = [(R_{bi} \cdot C(\gamma') + K_{bi})^2 + S(\gamma')^2]^{1/2},$$

where $R_{bi}$ and $K_{bi}$ are empirical fitting parameters for the specific buffer type. If this slew calculation is greater than the constraint, the procedure again returns the existing solution set without modification (134).

If the slew for the new solution passes the slew constraint, an existing solution is selected for domination checks (138). The old solution is considered to dominate the new solution if the slew, cost and capacitance of the old solution are less than or equal to the slew, cost and capacitance of the new solution, i.e., if $C(\gamma) \leq C(\gamma')$, $S(\gamma) \leq S(\gamma')$ and $W(\gamma) \leq W(\gamma')$. If the old solution dominates (140), the procedure returns the existing solution set without modification (134). If the old solution does not dominate, the procedure checks to see if the new solution dominates (142). The new solution is considered to dominate the old solution if the slew, cost and capacitance of the new solution are less than or equal to the slew, cost and capacitance of the old solution, i.e., if $C(\gamma') \leq C(\gamma)$, $S(\gamma') \leq S(\gamma)$ and $W(\gamma') \leq W(\gamma)$. If the new solution dominates, the old solution is removed from the solution set (144). After the domination checks, the next existing solution is selected for analysis (146). If all existing solutions have been examined regarding domination and the new solution has not been eliminated, the new solution is inserted into the solution set (148), and the procedure returns the modified solution set (134).

Figure 6A:
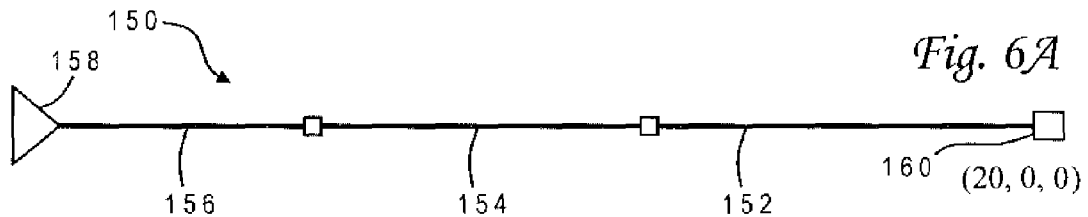
FIGS. 6A-6D are schematics diagrams of a wire branch showing a progression for candidate buffer solutions in accordance with one example of the present invention.

FIGS. 6A-6D illustrate an example of how the invention is applied to a wire branch 150 having three wire sections 152, 154, 156 between an input source 158 and a sink 160, with two potential buffer insertion locations. In this example, the initial solution for sink 160 is given as (20, 0, 0), that is, a capacitance of 20, a slew of zero, and a cost of zero, as shown in FIG. 6A. These values represent theoretical designer units that correspond to actual measurements, but the specific units may vary according to designer preferences. In a typical implementation the delay and slew values would correspond to a measurement on the order of picoseconds, and the capacitance values would correspond to a measurement on the order of femtofarads.

Figure 6B:
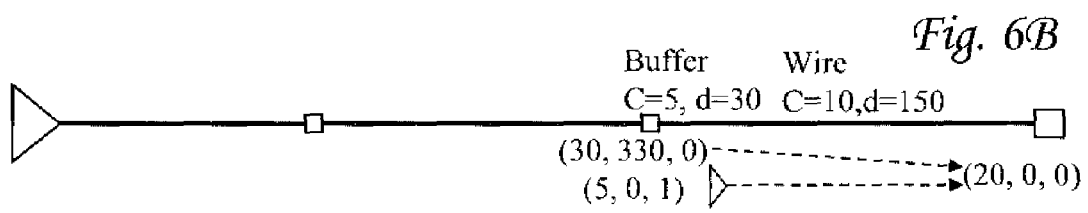
Figure 6C:
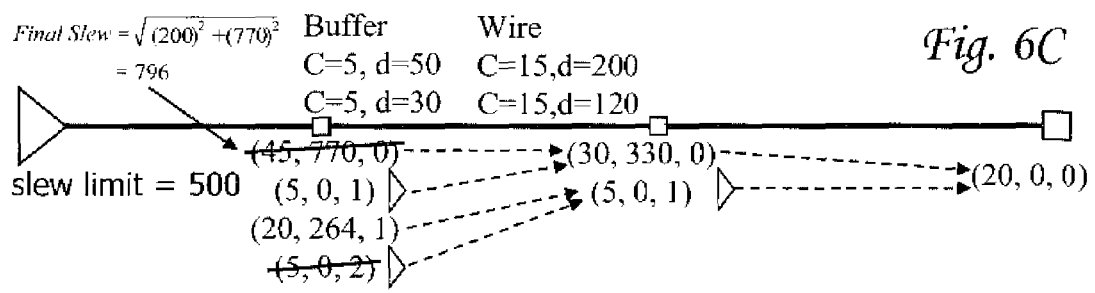

As further seen in FIG. 6B, the first wire section 152 has an intrinsic capacitance of 10 and a delay of 150, and one buffer type is provided for possible insertion at the first buffer location (in the direction of postorder traversal) with that buffer having a capacitance of 5 and a delay of 30. Two new solutions are derived using the foregoing formulas, one for the buffer inserted at the first location and another for no buffer inserted at that location. If the butter is inserted, the capacitance becomes five, the slew stays at 0, and the cost is 1. If no buffer is inserted at the first location, the capacitance becomes 30, the slew 330, and the cost 0. These two solutions propagate toward source 158 as further shown in FIG. 6C. The second wire section 154 has a capacitance of 15, and a delay of 200 if no buffer was inserted at the first location, or a delay of 120 if a buffer was inserted. The buffer again has a capacitance of 5, and a delay of 50 if the previous location has no buffer, or a delay of 30 if the previous located is buffered. Four new solutions are then derived: one solution has no buffers at either location and results in a capacitance of 45, a slew of 770, and zero cost; another solution has a buffer at the second location but no buffer at the first location and results in a capacitance of 5, zero slew, and a cost of 1, another solution has a buffer at the first location but no buffer at the second location and results in a capacitance of 20, a slew of 264, and a cost of 1; the fourth solution has buffers at both locations and results in a capacitance of 5, zero slew, and a cost of 2.

Figure 6D:
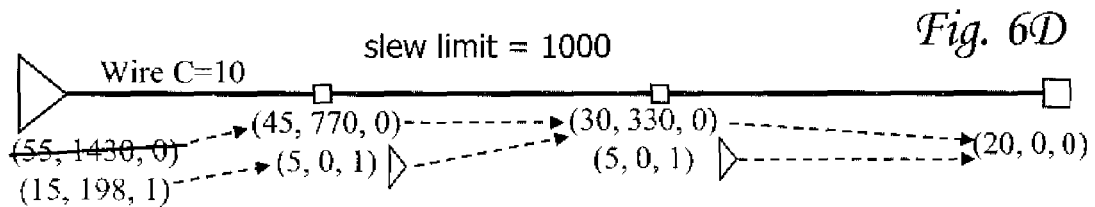

At this point in the process some solutions might be eliminated depending upon the slew constraint. For example, if the slew limit is 500, then the first of these solutions is eliminated—the final slew when factoring in the gate slew of 200 from source 158 is 796. The solution (5, 0, 2) is also eliminated since it is dominated by solution (5, 0, 1). Alternatively, if the slew limit is 1000 the latter two solutions will be eliminated since they are dominated, i.e., solution (20, 264, 1) and solution (5, 0, 2) are both dominated by solution (5, 0, 1). This scenario is illustrated in FIG. 6D, which also shows the final propagation of the solutions to source 158. Assuming a capacitance of 10 for the third wire section 156, two solutions are derived: one solution has no buffers at either location and results in a capacitance of 55, a slew of 1430, and zero cost; another solution has a buffer at the second location but no buffer at the first location and results in a capacitance of 15, a slew of 198, and a cost of 1. The first of these solutions violates the slew limit and is eliminated, leaving the final solution of (15, 198, 1).

The buffering technique of the present invention may be used as part of a physical synthesis methodology which inserts buffers early in the process for electrical correction so that timing analysis uses legal slew constraints. Buffers on critical nets can later be removed and replaced. It is estimated that only a small fraction (5-10%) of the buffers in an IC net will need to be re-buffered for delay optimization, as most of the buffers derived from slew-based insertion are sufficient to meet the net's timing criteria. The invention is particularly beneficial since the designer does not need to know the required arrival times at sinks, so it can be used earlier in the design flow than traditional buffering techniques. The invention may be performed totally independent of the timing analysis, i.e., incremental timing is not required between buffering of individual nets.

For a single buffer type, an optimal linear solution is achievable and for multiple buffer types the present invention still produces an efficient solution. In an experimental computation of CPU requirements using the same buffer library, runtime was speeded up by a factor of 25-30, with up to a 21% buffer area reduction. In another experimental computation for area comparison with similar runtimes, buffer area was reduced by 41%-56% (timing buffering used four buffers and slew-based buffering uses 48 buffers, with runtimes of about 50 seconds). Thus, the present invention not only saves turn-around time, but also results in a buffered circuit that is smaller and consumes less power. The invention is especially efficient in the presence of blockages and its handling of multi-fanout nets.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the present invention has been disclosed in the context of a binary routing tree having only two branches at each vertex, it could easily be expanded to other tree structures. It is therefore contemplated that such modifications can be made without departing from the spirit or scope of the present invention as defined in the appended claims.

What is claimed is:

1. A method of providing a buffer tree for a net of an integrated circuit design, comprising:

building an initial solution set for the buffer tree from initial solutions for sinks of the net wherein solutions have associated cost, slew and capacitance components;

generating sets of candidate solutions for wire branches of the net which originate at the sinks and extend toward a source of the net wherein the candidate solutions have associated cost, slew and capacitance components derived by selectively inserting at least one buffer along a given wire branch, setting the slew component of a candidate solution for the given wire branch to zero, incrementing the cost component of the candidate solution based on the inserted buffer, setting the capacitance component of the candidate solution to an intrinsic capacitance of the inserted buffer, increasing the capacitance component of the candidate solution by adding a wire capacitance of any new wire section connected between the source and the inserted buffer, and increasing the slew component of the candidate solution by adding a wire slew of the new wire section; merging candidate solutions for two wire branches by summing the capacitance component of the two wire branches, summing the cost components of the two wire branches, and selecting a maximum slew component from the two wire branches;

updating the candidate solution sets by disregarding any candidate solutions whose slew component is greater than a slew constraint; and selecting a final solution which has a smallest cost component from updated candidate solution sets.

2. The method of claim 1 wherein:

the buffers are selected from a buffer library having different buffer types; and the candidate solutions are generated for more than one buffer type in the library.

3. The method of claim 1 wherein said updating includes eliminating any candidate solution whose associated cost, slew and capacitance components are dominated by the associated cost, slew and capacitance components of another candidate solution.

4. The method of claim 1 wherein said generating includes merging solutions of two intersecting wire branches by adding branch capacitance and cost components, and selecting a highest branch slew component.

* * * * *